United States Patent [19]

Hayamizu et al.

[11] Patent Number: 5,741,580
[45] Date of Patent: Apr. 21, 1998

[54] CRYSTALLINE THIN FILM AND PRODUCING METHOD THEREOF, AND ACOUSTOOPTIC DEFLECTION ELEMENT

[75] Inventors: Shunichi Hayamizu, Amagasaki; Tomoji Kawai, Minoo; Hitoshi Tabata, Takatsuki, all of Japan

[73] Assignee: Minolta Co., Ltd., Osaka, Japan

[21] Appl. No.: 696,149

[22] Filed: Aug. 13, 1996

[30] Foreign Application Priority Data

Aug. 25, 1995 [JP] Japan .................................. 7-217099
Aug. 25, 1995 [JP] Japan .................................. 7-217100
Aug. 25, 1995 [JP] Japan .................................. 7-217101

[51] Int. Cl.$^6$ ............................. B32B 7/00; B32B 7/02
[52] U.S. Cl. ............................. 428/221; 428/119
[58] Field of Search ............................ 428/119, 221

[56] References Cited

PUBLICATIONS

Hirotoshi SATO et al., "Highly transparent and conductive group IV impurity–doped ZnO thin films prepared by radio frequency magnetron sputtering," J. Vac. Sci. Technol. A. 11,(6), Nov./Dec. 1993, pp. 2975–2979.

C.R. AITA et al., "The Effect of $O_2$ on reactively sputtered zinc oxide," J. Appl. Phys. 51(10), Oct. 1980, pp. 5533–5536.

Takashi Yamamoto et al., "Characterization of ZnO piezo-electric films prepared by rf planar–magnetron sputtering," J. Appl. Phys. 51(6), Jun. 1980, pp. 3113–3120.

Primary Examiner—Terressa Mosley
Attorney, Agent, or Firm—Burns, Doane, Swecker & Mathis, LLP

[57] ABSTRACT

A thin film having a good orientation and crystallinity. A method of producing the thin film on a substrate, wherein materials of a thin film are deposited and/or crystallized on a substrate. When a laser ablation method is adopted, the temperature of the glass substrate is set in the range between 200° C. and 700° C., and the pressure of $O_2$ gas in a film forming chamber is set in the range between $7\times10^{-5}$ Torr and $1\times10^{-2}$ Torr. A laser beam irradiates a ZnO target. The target radiates materials of a thin film, such as neutral ions, molecules and ions, and the radiated materials are deposited and/or crystallized on the glass substrate to turn into a ZnO thin film.

43 Claims, 4 Drawing Sheets

CRYSTALLINE THIN FILM AND PRODUCING METHOD THEREOF, AND ACOUSTOOPTIC DEFLECTION ELEMENT

BACKGROUND OF THE INVENTION

1. Field of the Invention

The present invention relates to a crystalline thin film, and more particularly to a crystalline thin film which is used as a transparent electrode layer and used for an acoustooptic deflection element, and a producing method thereof. Also, the present invention relates to an acoustooptic deflection element.

2. Description of Related Art

Recently, a laser ablation method draws attention as a method of forming an inorganic thin film, especially forming a feroelectric or piezoelectric thin film which has a high crystallinity and excellent characteristics. The laser ablation method is to form a thin film by exposing a solid target to a laser beam and depositing and/or crystallizing neutral atoms, molecules and ions which are radiated from the target on a substrate.

The main reasons why the laser ablation method draws attention are as follows: (1) the atmosphere and the pressure in a film forming chamber can be regulated to ones proper for growth of crystal because the laser beam is directed from the outside of the film forming chamber; (2) a thin film with no impurities can be formed because the materials are radiated only from the target; and (3) the parameters such as pressure, substrate temperature, film forming speed, etc. can be set independently.

On the other hand, a sputtering method, a CVD method, etc. are well known as film forming methods. Conventionally, the sputtering method or the CVD method is adopted to form a ZnO thin film which is a piezoelectric inorganic thin film.

However, a very thin (approximately 200 nm) film of ZnO formed by the sputtering method or the CVD method has a problem of having a poor crystallinity and a poor orientation. Especially when a glass substrate is used, it is impossible to form a ZnO film which has a thickness of approximately 200 nm and has a good orientation because the glass substrate is amorphous.

SUMMARY OF THE INVENTION

An object of the present invention is to provide a novel and advantageous thin film which does not have the above problems, and a producing method thereof.

Another object of the present invention is to obtain a thin film which has a good orientation.

Another object of the present invention is to obtain a thin film which has a good crystallinity.

Another object of the present invention is to obtain a very thin film which has a good crystallinity and a good orientation.

Another object of the present invention is to obtain a thin film with no impurities.

Another object of the present invention is to provide a thin film forming method which can form a thin film with a desired resistivity.

Another object of the present invention is to provide a thin film forming method in which parameters can be set independently.

Another object of the present invention is to provide a thin film forming method in which environments in a film forming chamber can be controlled.

Another object of the present invention is to form a thin film with a good crystallinity and a good orientation on a glass substrate.

In order to attain the objects, according to the present invention, in an atmospheric pressure of $O_2$ gas in the range between $7 \times 10^{-5}$ Torr and $1 \times 10^{-2}$ Torr, a ZnO target is irradiated by a laser beam, and materials which are radiated from the ZnO target by the laser irradiation is deposited on a glass substrate heated to a temperature in the range between 200° C. and 700° C. so as to form a ZnO thin film on the glass substrate.

Further, the ZnO target may contain a heterocompound.

Another film forming method according to the present invention comprises a first process of forming a first crystalline thin film on a substrate, and a second process of forming a second crystalline thin film on the first thin film under a different condition from the first process.

Further, in another film forming method according to the present invention, after a substrate is treated with a compound which contains an element selected from the group consisting of alkaline metals, alkaline earth metals and boron, a crystalline thin film is formed on the substrate.

Furthermore, in another film forming method according to the present invention, after an undercoating layer is provided on a substrate, a crystalline thin film is formed on the undercoating layer.

BRIEF DESCRIPTION OF THE DRAWINGS

These and other objects and features of the present invention will be apparent from the following description with reference to the accompanying drawings, in which.

DETAILED DESCRIPTION OF THE PREFERRED EMBODIMENTS

Figure 1:
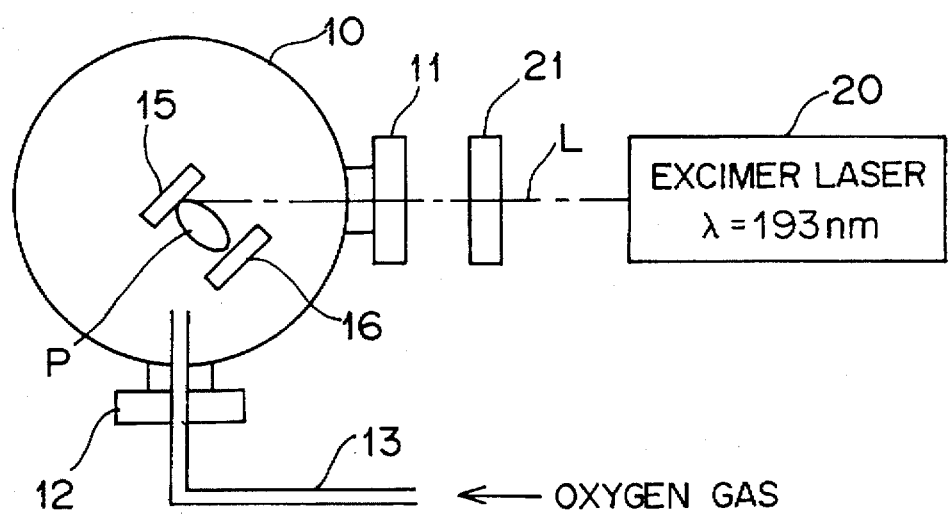
FIG. 1 is a schematic view of a laser ablation machine which is used to form a thin film in a method according to the present invention.

Preferred embodiments of the present invention are described with reference to the accompanying drawings.

The present invention intends to obtain an crystalline inorganic thin film formed on a substrate.

Various kinds of inorganic materials can be used as the material of the thin film. Considering the feroelectricity and the piezoelectricity, ZnO, $LiNbO_3$, $LiTaO_3$, PZT, etc. are proper as the material. A thin film made of such a material with feroelectricity and piezoelectricity can be used for an acoustooptic deflection element. Especially, ZnO is a desirable material because ZnO has a good piezoelectricity, a good transparence, a large diffraction factor and a good film-forming characteristic.

As the substrate, various kinds of materials can be used, glass, sapphire, silicon, $LiNbO_3$ single crystal, etc. are proper. Glass is especially desirable because glass is inexpensive and because it is relatively easy to form a thin film with a desired orientation on a glass substrate. If sapphire is used as the substrate, it is advantageous to form a thin film with an excellent orientation because sapphire has a high crystallinity. Silicon has advantages of being relatively inexpensive and of having a good heat radiation characteristic.

Various kinds of well-known film forming methods, such as a laser ablation method, an RF sputtering method, an ECR sputtering method, a CVD method, etc. can be adopted. The laser ablation method is proper for the above-described reasons.

The orientation of a thin film can be improved by changing a condition in the middle of film formation. Changing a condition means, for example, changing the temperature of the substrate or changing the rate of film formation. Generally, while a substrate is cooled after film formation, a residual thermal stress occurs on a formed film. The strength of the residual thermal stress is proportional to the temperature of the substrate during the film formation. Therefore, by starting the film formation with the substrate at a relatively high temperature and lowering the temperature of the substrate in the middle of film formation, it is possible to form a thin film with a small residual thermal stress. Also, by starting film formation at a high rate and lowering the rate in the middle of film formation, a thin film with a good crystallographic orientation, especially c-axis orientation can be formed speedily.

It is possible to change methods in the middle of film formation. For example, film formation is started adopting the laser ablation method, and in the middle of film formation, the method is changed to the CVD method. Thereby, a thin film with a good crystallographic orientation can be formed speedily.

By treating a substrate beforehand, the orientation of a thin film can be improved. The treatment of the substrate is carried out by use of a compound containing an element selected from the group of alkaline metals, such as Na, Li, K, Rb, Cs, Fr, alkaline earth metals, such as Ba, Sr, Ra, and boron. More specifically, for example, the substrate is dipped in an aqueous solution of sodium hydroxide, barium hydroxide or the like.

By providing an undercoating layer on the surface of a substrate, the crystallinity and the orientation of a thin film can be improved. A glass substrate has minute roughness on the surface because of polishing or the like. By providing an undercoating layer on the surface, the roughness is eased, and the crystallinity and the orientation of a thin film formed thereon are improved.

The undercoating layer may be a compound containing $SiO_2$, a compound containing an alkaline metal, such as $Na_2O$, etc., a compound containing an alkaline earth metal, such as BaO, etc., and a compound containing a halide of an alkaline metal or alkaline earth metal, such as $MgF_2$, etc.

The undercoating layer can be formed on the surface of the substrate by the sputtering method, the CVD method or the like. The proper thickness of the undercoating layer is approximately 10 nm.

When the laser ablation method adopted for film formation, if the pressure of $O_2$ gas is set in the range between $7 \times 10^{-5}$ Torr and $1 \times 10^{-2}$ Torr and if the temperature of the substrate is set in the range between 200° C. to 700° C., a thin film which has a fair crystallographic orientation, and more specifically, which has a FWHM in the range between 4° and 5.9°. This is possible as long as the thickness of the thin film is not less than 50 nm. If the temperature of the substrate is in the range between 360° C. and 600° C. and if the pressure of $O_2$ gas is in the range between $2 \times 10^{-4}$ Torr and $2.5 \times 10^{-3}$ Torr, a thin film which has a good crystallographic orientation with a FWHM of not more than 3.9°. Further, if the temperature of the substrate is in the range between 500° and 600° C. and if the pressure of $O_2$ gas is in the range between $2 \times 10^{-4}$ Torr and $6 \times 10^{-4}$ Torr, a thin film which has an excellent crystallographic orientation with a FWHM of not more than 1.9°.

In the laser ablation method, by using a target containing a heterocompound, the resistivity of a formed thin film can be controlled. As the hetero compound, a compound which contains an atom different from Zn and O can be used. When a compound including I B element which has lower valence than Zn or V B element which has lower valence than 0 is used as the heterocompound, the resistivity of the ZnO film to be obtained may be increased. And when a compound including III B element which has grater valence than Zn or halogen atom which has grater valence than 0 is used as the heterocompound, the resistivity of the ZnO film to be obtained may be reduced. For example, if a ZnO target containing Cu is used to form a ZnO thin film, the ZnO thin film has a high resistivity. Although the ZnO thin film takes in Cu, the crystallographic orientation of the thin film is hardly influenced. In this way, a ZnO thin film which is suitable to be used in an acoustooptic deflection element or used as a transparent electrode can be obtained. If a ZnO target containing Al is used to form a ZnO thin film, the ZnO thin film has a low resistivity. Although the ZnO thin film takes in Al, the crystallographic orientation of the thin film is hardly influenced. In this way, a ZnO thin film which can be used as a transparent electrode can be obtained.

Generally, it is difficult to form a ZnO thin film which has a high resistivity because the film has donor type conductivity due to interstitial zinc and a lack of oxygen. However, when a ZnO target containing Cu is used to form a ZnO thin film, the thin film takes Cu as an acceptor, thereby erasing charge, and consequently, the ZnO thin film has a high resistivity. On the other hand, it is difficult to form a ZnO thin film which has a resistivity of not more than $10^{-2}$ $\Omega$cm even if annealing and other processes are adopted. However, when a ZnO target containing Al is used to form a ZnO thin film, the thin film takes Al as a donor, and consequently, the ZnO thin film has a low resistivity.

In the laser ablation method, a KrF excimer laser, and XeCl excimer laser, an XeF excimer laser or the like can be used as a light source. The frequency and the energy density of the laser beam can be set arbitrarily in accordance with the conditions of film formation.

Experimental Example 1

FIG. 1 shows a laser ablation machine. In a film forming chamber 10, a target 15 and a substrate 16 are placed with a specified space in-between. A laser beam L emitted from a light source unit 20 is directed into the film forming chamber 10 through a lens 21 and a window 11 so as to irradiate the target 15. An exhaust outlet (not shown) is provided in the film forming chamber 10 to evacuate the chamber 10, and the exhaust outlet is connected to a vacuum device (not shown). Further, a gas pipe 13 for supplying oxygen gas is connected to a gas inlet flange 12 connected to the film forming chamber 10.

By use of the laser ablation machine, ZnO films were formed under the conditions described below.

The target 15 was sintered ZnO which was prepared as follows: ZnO powder with a purity of 99.999% was press-molded under a pressure of approximately 200 kg/cm$^2$; and the press-molded ZnO was sintered in a temperature of 1000° C. for 24 hours. The ZnO target 15 was placed substantially in the center of the film forming chamber 10, and the substrate 16 was placed in opposite to and in parallel with the ZnO target 15. The distance between the substrate 16 and the ZnO target 15 was 30 mm. A glass substrate (#7059 manufactured by Corning Co., Ltd.) was used as the substrate 16. After being subjected to ultrasonic cleaning with a neutral detergent for five minutes, with pure water for five minutes and with acetone for five minutes, the glass substrate 16 was set in the film forming chamber 10.

Then, the inside of the film forming chamber 10 was evacuated to $1\times10^{-6}$ Torr, and $O_2$ gas was supplied to the chamber 10 until the pressure in the chamber 10 became a specified value. The reason why $O^2$ gas was supplied is described below. Generally, a ZnO film formed on a glass substrate by the laser ablation method is unlikely to contain zinc and oxygen at a ratio of 1:1 because of a slight lack of oxygen. The lack of oxygen can be solved by forming a film in an oxygen atmosphere. Further, part of the $O^2$ gas (approximately 8%) was ozonized by an ozonizer. Because ozone is active, it solves the lack of oxygen more effectively.

Next, the glass substrate 16 was heated to a specified temperature by a heater (not shown), and the ZnO target 15 was irradiated by the laser beam L. An ArF excimer laser was used as the light source unit 20. The laser beam L was a pulse laser with a frequency of 5 Hz, and the energy density on the target 15 was 1 J/cm². As the laser beam L was irradiating the ZnO target 15, small particles such as neutral atoms, molecules, ions, etc. which would be materials of a film were radiated from the ZnO target 15, thereby making a plume P. The radiated materials were deposited on the glass substrate 16 and crystallized. The rate of film formation was monitored by a thickness meter using a quartz oscillator and was kept at 4 nm/minute. The temperature of the glass substrate 16 was set arbitrarily in the range between a room temperature to 700° C., and the pressure of $O_2$ gas was set arbitrarily in the range between $7\times10^{-5}$ Torr and $1\times10^{-1}$ Torr. Under the conditions, various kinds of ZnO films with thicknesses of 200 nm were formed.

Figure 2:
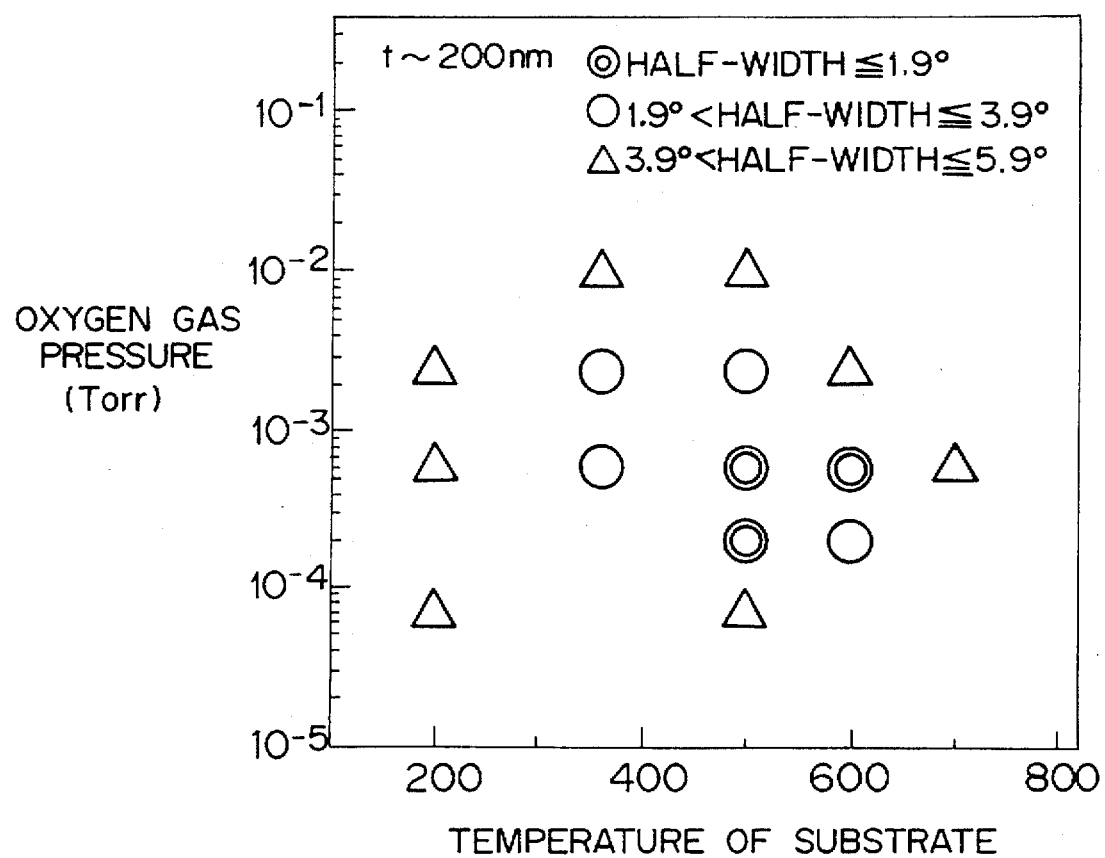
FIG. 2 is a graph showing the relationship between the film forming conditions and the full width at half maximum (hereinafter referred to as "FWHM") of a locking curve of an X-ray diffraction peak from (002) surface.

The ZnO films formed in this way were evaluated about the crystal structure and the orientation by an X-ray diffraction method (θ–2θ method, locking curve method). As a result, all the ZnO films have a crystallographic orientation of <001> axis in a perpendicular direction to the surface of the glass substrate 16 (c-axis orientated film). Further, in order to study the c-axis orientation of each ZnO film, the fluctuation of <001> axis with respect to the perpendicular direction to the surface of the glass substrate 16 was evaluated as a FWHM of a locking curve of an X-ray diffraction peak from (002) surface. FIG. 2 shows the relationship between film forming conditions (the temperature of substrate and the pressure of $O_2$ gas) and the FWHM.

Figure 3:
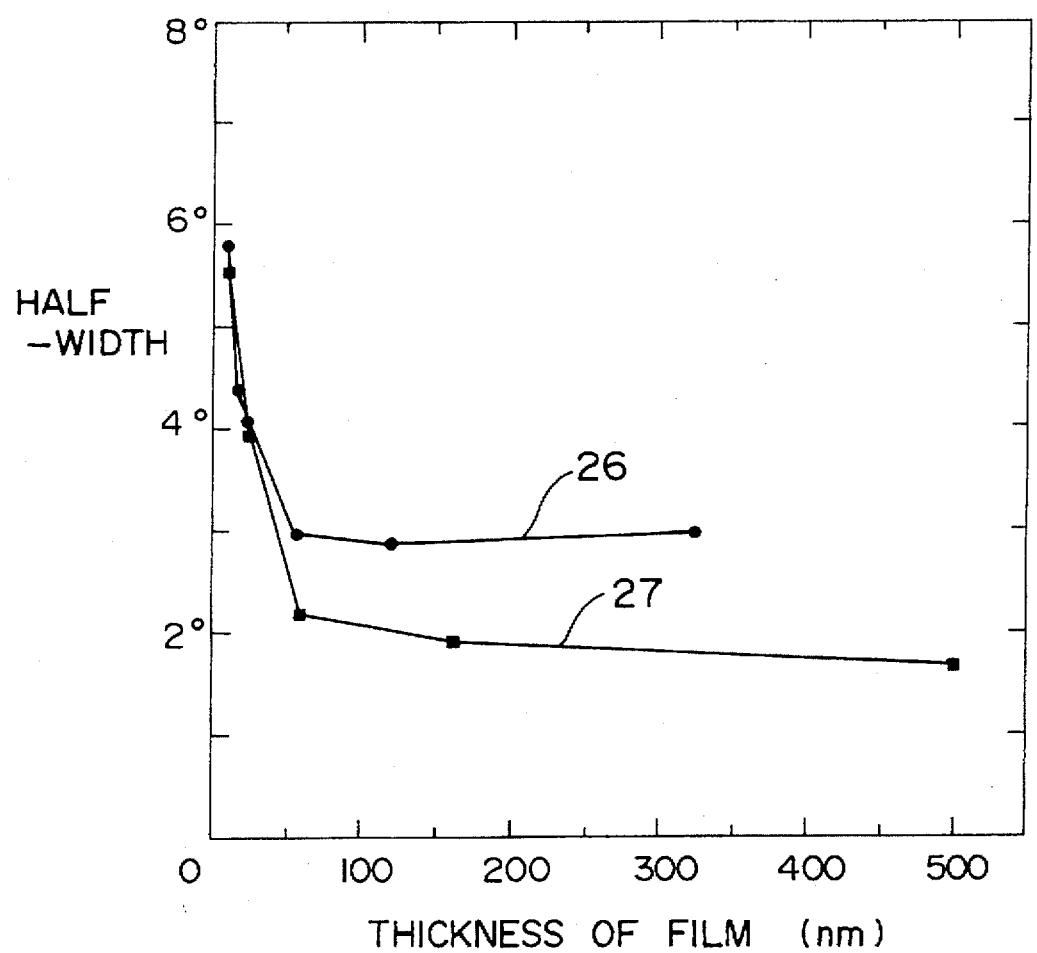
FIG. 3 is a graph showing the relationship between the thickness of a thin film and the FWHM of a locking curve of an X-ray diffraction peak from (002) surface.

FIG. 3 shows the relationship between the thickness of a film and a FWHM. In both cases showed by the solid lines 26 and 27, the pressure of $O_2$ gas was $6\times10^{-4}$ Torr. In the case showed by the line 26, the temperature of substrate was 360° C., and in the case showed by the line 27, the temperature of substrate was 500° C. Under these conditions, films with thicknesses from 30 nm to 500 nm were formed.

Experimental Example 2

Because the same laser ablation machine as used in Experimental Example 1 was used in Experimental Example 2, the description of the structure of the machine is omitted. The target 15 was sintered ZnO which was prepared as follows: ZnO powder with a purity of 99.999% mixed with $Cu_2O$ powder with a purity of 99% at a mixing ratio of approximately 1.3 mol % was press-molded under a pressure of approximately 200 kg/cm²; and the press-molded ZnO was sintered in a temperature of 1000° C. for 24 hours. A glass substrate (#7059 manufactured by Corning Co., Ltd.) was used as the substrate 16. The glass substrate 16 was subjected to the ultrasonic cleaning described in connection with Experimental Example 1.

Next, the temperature of the glass substrate 16 was set to 500° C., and the pressure of $O_2$ gas was set to $6\times10^{-4}$ Torr. Under these conditions, a ZnO film with a thickness of 200 nm was formed at a rate of 4 nm/minute.

The ZnO film formed in this way was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve of an X-ray diffraction peak from (002) surface. As a result, the FWHM was 3.0°, and the ZnO film has a good c-axis orientation. Moreover, the ZnO film has a high resistivity of not less than $10^7$ Ωcm.

Experimental Example 3

Because the same laser ablation machine as used in the Experimental Example 1 was used in Experimental Example 3, the description of the structure of the machine is omitted. The target 15 was sintered ZnO which was prepared as follows: ZnO powder with a purity of 99.999% mixed with $Al_2O_3$ powder with a purity of 99.9% at a mixing ratio of approximately 1.0 mol % was press-molded under a pressure of approximately 200 kg/cm²; and the press-molded ZnO was sintered in a temperature of 1000° C. for 24 hours. A glass substrate (#7059 manufactured by Corning Co., Ltd.) was used as the substrate 16. The glass substrate 16 was subjected to the ultrasonic cleaning described in connection with Experimental Example 1.

Next, the temperature of the glass substrate 16 was set to 500° C., and the pressure of $O_2$ gas was set to $6\times10^{-4}$ Torr. Under these conditions, a ZnO film with a thickness of 200 nm was formed at a rate of 4 nm/minute.

The ZnO film formed in this way was evaluated about the crystal structure and the orientation by the X-ray diffraction method. As a result, the ZnO film has crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve of an X-ray diffraction peak from (002) surface. As a result, the FWHM was 2.8°, and the ZnO film has a good crystallographic orientation. Moreover, the ZnO film has a low resistivity of $5\times10^{-3}$ Ωcm.

Experimental Example 4

Since the laser ablation machine used in Experimental Example 1 was used in Experimental Example 4, the detailed description of the machine is omitted. As the target 15, a ZnO target prepared in the same way as Experimental Example 1 was used. A glass substrate (#7059 manufactured by Corning Co., Ltd.) was used as the substrate 16. The glass substrate 16 was subjected to the ultrasonic cleaning described connection with Experimental Example 1.

The glass substrate 16 was set in the laser ablation machine and heated to a specified temperature. Next, the pressure of $O_2$ gas was set to $6\times10^{-4}$ Torr. Then, the ZnO target 15 was irradiated by the laser beam L. As the laser beam L was irradiating the ZnO target 15, small particles which would be materials of a film were radiated from the ZnO target 15. The radiated materials were deposited on the glass substrate 16 and crystallized. The rate of film formation was 4 nm/minute. The temperature of the glass substrate 16 was kept at 500° C. until the thickness of the film became 70 nm (first process), and thereafter the temperature was changed to 360° C. (second process). In this way, a ZnO film which has a thickness of 200 nm was formed.

The ZnO film was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve of an X-ray diffraction peak from (002) surface. As a result, the FWHM was 2.0° (see Table 1), and the ZnO film has a good c-axis orientation. For comparison, Table 1 also shows the results of evaluation of ZnO films which were formed while the temperature of glass substrate was kept at 360° C. or 500° C. at all stages.

TABLE 1

| Temperature of Glass Substrate | Half-width |
| --- | --- |
| 500° C. at an early stage +360° C. | 2.0° |
| 360° C. (comparative case) | 3.0° |
| 500° C. (comparative case) | 1.9° |

As is apparent from Table 1, the crystallographic orientation of the ZnO film formed in Experimental Example 4 is better than that of the ZnO film which was formed while the temperature of glass substrate was kept at 360° C. at all stages and is almost as good as that of the ZnO film which was formed while the temperature of glass substrate was kept at 500° C. at all stages.

Experimental Example 5

Since the laser ablation machine used in Experimental Example 1 was used in Experimental Example 5, the detailed description of the machine is omitted. As the target 15, a ZnO target prepared in the same way as Experimental Example 1 was used. A glass substrate (#7059 manufactured by Corning Co., Ltd.) was used as the substrate 16. The glass substrate 16 was subjected to the ultrasonic cleaning described in connection with Experimental Example 1.

The temperature of the glass substrate 16 was set to 500° C., and the pressure of $O_2$ gas pressure was set to $6\times10^{-4}$ Torr. Then, the ZnO target 15 was irradiated by the laser beam L to radiate small particles which would be materials of a film. The radiated materials were deposited on the glass substrate 16 and crystallized. The rate of film formation was kept at 4 nm/minute until the thickness of the film became 70 nm (first process) and thereafter was changed to 12 nm/minute (second process). The acceleration of the rate of film formation can be carried out by heightening the frequency of the pulse laser, heightening the energy density on the target 15 or the like. In this way, a ZnO film with a thickness of 200 nm was formed.

The ZnO film was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve of an X-ray diffraction peak from (002) surface. As a result, the FWHM was 2.0° (see Table 2), and the ZnO film has a good c-axis orientation. For comparison, Table 2 also shows the results of evaluation of ZnO films which were formed while the rate of film formation was kept at 12 nm/minute or 4 nm/minute at all stages.

TABLE 2

| Rate of Film Formation | Half-width |
| --- | --- |
| 4 nm/minute at an early stage + 12 nm/minute | 2.0° |
| 12 nm/minute (comparative case) | 3.2° |
| 4 nm/minute (comparative case) | 1.9° |

As is apparent from Table 2, the crystallographic orientation of the ZnO film formed in Experimental Example 5 was better than that of the ZnO film which was formed while the rate of film formation was kept at 12 nm/minute at all stages and was almost as good as that of the ZnO film which was formed while the rate of film formation was kept at 4 nm/minute at all stages.

Experimental Example 6

In Experimental Example 6, a thin film was formed by a combination of the laser ablation method and the RF sputtering method. Since the laser ablation machine used in Experimental Example 1 was used in Experimental Example 6, the detailed description of the machine is omitted. As the target 15, a ZnO target prepared in the same way as Experimental Example 1 was used. A glass substrate (#7059 manufactured by Corning Co., Ltd.) was used as the substrate 16.

The glass substrate 16 was subjected to the ultrasonic cleaning described in connection with Experimental Example 1 and thereafter was set in the laser ablation machine. The temperature of the glass substrate 16 was set to 500° C., and the pressure of $O_2$ gas was set to $6\times10^{-4}$ Torr. Then, the ZnO target 15 was irradiated by the laser beam L to radiate small particles which would be materials of a film. The radiated materials were deposited on the glass substrate 16 and crystallized. The rate of film formation was 4 nm/minute. This first film forming process by the laser ablation method was stopped when the thickness of the film became 70 nm. The glass substrate 16 was taken out from the laser ablation machine and was set in an RF sputtering machine.

Then, a second film forming process by the RF sputtering method was carried out under conditions shown by Table 3. In this way, a ZnO film with a thickness of 200 nm was formed on the glass substrate 16.

TABLE 3

| | Film Forming Condition |
| --- | --- |
| Temperature of Glass Substrate | 350° C. |
| Ratio of Supplied Gasses | $Ar:O_2 = 2:1$ |
| Sputtering Gas Pressure | $2\times10^{-3}$ Torr |
| Rate of Film Formation | 12 nm/minute |

The ZnO film was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve of an X-ray diffraction peak from (002) surface. As a result, the FWHM was 2.2° (see Table 4), and the ZnO film has a good c-axis orientation. For comparison, Table 4 also shows the results of evaluation of ZnO films which were formed only by the laser ablation method or only by the RF sputtering method.

TABLE 4

| Film Forming Method | Half-width |
| --- | --- |
| laser ablation method at an early stage + RF sputtering method | 2.2° |
| only RF sputtering method (comparative case) | 4.8° |
| only laser ablation method (comparative case) | 1.9° |

As is apparent from Table 4, the crystallographic orientation of the ZnO film formed in Experimental Example 6 was better than that of the ZnO film formed only by the RF sputtering method and was almost as good as that of the ZnO film formed only by the laser ablation method.

Experimental Example 7

Since the laser ablation machine used in Experimental Example 1 was used in Experimental Example 7, the detailed description of the machine is omitted. As the target 15, a ZnO target prepared in the same way as Experimental Example 1 was used. A glass substrate (#7059 manufactured by Corning Co., Ltd.) was used as the substrate 16.

The glass substrate 16 was subjected to ultrasonic cleaning with a neutral detergent for five minutes, with pure water for five minutes and with acetone for five minutes. Next, the glass substrate 16 was dipped in an aqueous solution of sodium hydroxide with a normality of 1N (water temperature: 40°) or in an aqueous solution of barium hydroxide with a normality of 1N (water temperature: 40° C.) for ten minutes. Thereafter, the glass substrate 16 was cleaned with pure water so lightly that Na or Ba stuck on the surface of the glass substrate 16 would not flow out.

Next, the glass substrate 16 was dried and was set in the film forming chamber 10. The temperature of the glass substrate 16 was set to 500° C., and the pressure of $O_2$ gas was set to $6 \times 10^{-4}$ Torr. In this way, a ZnO film with a thickness of 200 nm was formed at a rate of 4 nm/minute.

The ZnO film was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the e-axis orientation of the ZnO film, the fluctuation of <001> axis with respect to the perpendicular direction to the surface of the glass substrate 16 was evaluated as a FWHM of a locking curve of an X-ray diffraction peak from (002) surface. The results are shown in Table 5. When the glass substrate 16 was treated with an aqueous solution of sodium hydroxide, the FWHM was 1.6°, glassed when the glass substrate 16 was treated with an aqueous solution of barium hydroxide, the FWHM was 1.8°. In both cases, the formed ZnO film has a good c-axis orientation. For comparison, Table 5 also shows the result of evaluation of a ZnO film which was formed on a glass substrate which was not treated with an aqueous solution of sodium hydroxide nor an aqueous solution of barium hydroxide.

TABLE 5

| Aqueous Solution | Half-width |
| --- | --- |
| sodium hydroxide | 1.6° |
| barium hydroxide | 1.8° |
| none (comparative case) | 1.9° |

As is apparent from Table 5, treating the surface of the glass substrate 16 with an aqueous solution of sodium hydroxide or barium hydroxide improves the c-axis orientation of a ZnO film formed on the glass substrate 16.

Experimental Example 8

In Experimental Example 8, after an undercoating layer was formed on a glass substrate, a ZnO thin film was formed. The laser ablation machine used in Experimental Example 8 was the same as that used in Experimental Example 1 except containing two targets 15. The detailed description of the laser ablation machine is omitted.

The two targets 15 were set in the film forming chamber 10, and the positions of the targets 15 can be changed by a remote controller. One of the targets 15 was sintered ZnO which was prepared as described in connection with the Experimental Example 1. The other target 15 was sintered $SiO_2$ which was prepared as follows: $SiO_2$ powder was press-molded under a pressure of approximately 200 kg/cm²; and the press-molded $SiO_2$ was sintered in a temperature of 1000° C. for 24 hours.

First, the $SiO_2$ target 15 was located in opposition to and in parallel with the substrate 16. The distance between the $SiO_2$ target 15 and the substrate 16 was 30 mm. A glass substrate (#7059 manufactured by Corning Co., Ltd.) was used as the substrate 16. Before being set in the film forming chamber 10, the glass substrate 16 was subjected to ultrasonic cleaning with a neutral detergent for five minutes, with pure water for five minutes and with acetone for five minutes.

Next, the temperature of the glass substrate 16 was set to 500° C., and the pressure of $O_2$ gas was set to $6 \times 10^{-4}$ Torr. Then, the $SiO_2$ target 15 was irradiated by the laser beam L to radiate small particles which would be materials of an undercoating layer. The radiated materials were deposited on the glass substrate 16. In this way, a $SiO_2$ undercoating layer with a thickness of approximately 10 nm was formed on the glass substrate 16.

Next, the $SiO_2$ target 15 and the ZnO target 15 were moved so that the laser beam L would irradiate the ZnO target 15. As the laser beam L was irradiating the ZnO target 15, the ZnO target 15 radiated small particles which would be materials of a film. The radiated materials were deposited on the $SiO_2$ undercoating layer and crystallized. In this way, a ZnO film was formed. The rate of film formation was 4 nm/minute, and the thickness of the ZnO film was 200 nm.

The ZnO film was evaluated about the crystal structure and the orientation by the X-ray diffraction method. As a result, the ZnO film has a crystallographic orientation of <001> axis in a perpendicular direction to the surface of the glass substrate 16 (c-axis orientated film). Further, in order to study the c-axis orientation of the ZnO film, the fluctuation of <001> axis with respect to the perpendicular direction to the surface of the glass substrate 16 was evaluated as a FWHM of a locking curve off an X-ray diffraction peak from (002) surface. As shown in Table 6, the FWHM of the ZnO film was 1.7° and has a good c-axis orientation. For comparison, Table 6 also shows the result of the evaluation on of a ZnO film without a $SiO_2$ undercoating layer.

TABLE 6

| Undercoating Layer | Half-width |
|---|---|
| $SiO_2$ undercoating layer | 1.7° |
| none (comparative case) | 1.9° |

As is apparent from Table 6, providing a $SiO_2$ undercoating layer on the glass substrate 16 improves the c-axis orientation of a ZnO film.

Experimental Example 9

A surface acoustic wave element according to the present invention is described. The surface acoustic wave element includes filter element, acoustooptic deflection element and the like which are able to cause acoustic wave on the surface thereof. When an acoustooptic deflection element is applied by a surface acoustic wave with a specified wavelength, the refractive factor of the acoustooptic deflection element is changed, and accordingly the waveguide light propagation characteristic of the acoustooptic element is changed.

In experimental example 9, first, a ZnO thin film with a thickness of 3 μm was formed on a glass substrate in the same way as described in connection with Experimental Example 1. In order to study the piezoelectricity of the ZnO thin film, an interdigital transducer electrode was formed on the ZnO thin film. The interdigital transducer electrode has a width of 4 μm and a pitch of 4 μm. The electrode pattern was formed by photoetching.

For comparison, a ZnO thin film with a thickness of 3 μm was formed on a glass substrate by the sputtering method, and an interdigital transducer electrode was formed on the ZnO thin film. The conditions of the sputtering are shown by Table 7.

TABLE 7

| | Film Forming Condition |
|---|---|
| Substrate | Glass (#7059) |
| Temperature of Substrate | 35° C. |
| Sputter Pressure | $2 \times 10^{-3}$ Torr |
| $Ar/O_2$ | 80/20 |
| RF Power | 400 W |

Next, the electromechanical coupling factor $k^2$ of each of the ZnO films was calculated from an equivalent circuit obtained by measuring an admittance of to the interdigital transducer electrode. An electromechanical coupling factor $k^2$ is a value indicating the efficiency of conversion of electric energy into mechanical energy. The larger the value is, the better the efficiency of conversion is. The results are shown by Table 8.

TABLE 8

| Method of Film Formation | Electromechanical Coupling Factor $k^2$ |
|---|---|
| Sputtering Method | 0.006 |
| Laser Ablation Method | 0.009 |

As is apparent from Table 8, the electromechanical coupling factor $k^2$ of the ZnO thin film formed by the laser ablation method was larger it is possibly because the ZnO film formed by the laser ablation method had a better crystallinity and a better orientation.

Next, an input interdigital transducer electrode and an output interdigital transducer electrode were formed on each of the ZnO thin films, and the filter characteristics of the thin films to a surface acoustic wave with a center frequency of 160 MHz were compared. As a result, the ZnO thin film formed by the laser ablation method had a smaller loss by approximately 2 db.

Figure 4:
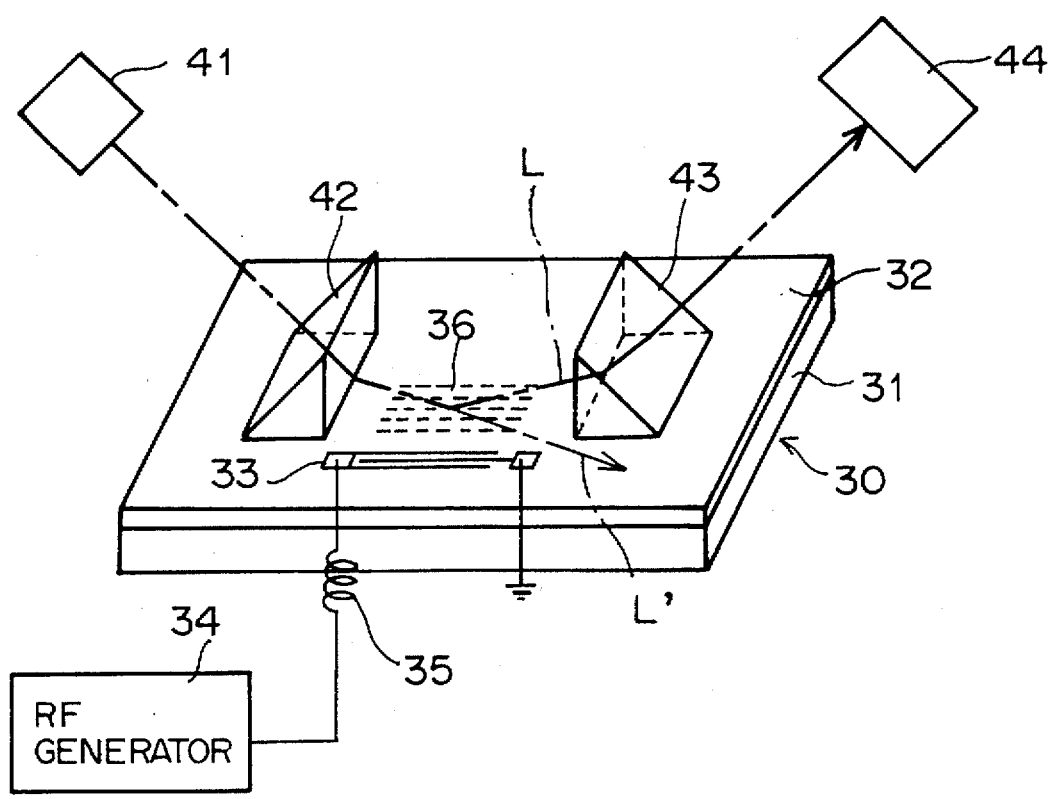
FIG. 4 a schematic view of a device for measuring the light deflecting characteristic of a thin film.

An experiment of deflection of a waveguide light caused by a surface acoustic wave was conducted by use of a measuring device shown by FIG. 4.

The measuring device is described referring to FIG. 4. An interdigital transducer electrode 33 is provided on a ZnO thin film 32 formed on a glass substrate 31, and the interdigital transducer electrode 33 is connected to an RF generator 34 through an impedance matching coil 35 so as to apply an acoustic surface wave with a high frequency of 160 MHz to the ZnO thin film. On the right and left sides of the ZnO thin film 32, an input coupler 42 and an output prism coupler 43 are provided. An He—Ne laser beam (632.8 nm, 5 mW) emitted from a light source 41 is incident to the ZnO thin film 32 through the incident prism coupler 42 and progresses in the ZnO thin film 32 as a waveguide light L. The waveguide light L intersects a surface acoustic wave 36 excited by the interdigital transducer electrode 33, thereby being diffracted by Bragg diffraction due to an acoustooptic effect and deflected. The deflected waveguide light L is emergent from the ZnO thin film through the emergent prism coupler 43.

By use of the measuring device, the intensity of the diffracted light L and the intensity of the non-diffracted light L' were measured by an optical powermeter 44, and the efficiency of diffraction was calculated. Also, the angle of deflection was measured.

As a result, whether the ZnO thin film 32 was formed by the laser ablation method or formed by the sputtering method, the angle of deflection was approximately 1.2°. In a case in which the ZnO thin film 32 was formed by the sputtering method, when a high-frequency power of 4.4 W was applied to the interdigital transducer electrode 33, the efficiency of diffraction was 90%. In a ease in which the ZnO thin film 32 was formed by the laser ablation method, when a high-frequency power of 2.7 W was applied to the interdigital transducer electrode 33, the efficiency of diffraction was 90%. It is possibly because the ZnO thin film 32 formed by the laser ablation method has a better crystallinity, a better orientation, a larger electromechanical coupling factor and a smaller loss of surface acoustic wave. The fact that a smaller power is necessary to obtain the same efficiency of diffraction indicates that heat around the interdigital transducer electrode 33 is low and that degradation of the interdigital transducer electrode 33 due to an acoustic surface wave is little.

Further, a similar experiment using a silicon substrate with an $SiO_2$ coating (about 0.8 μm) instead of a glass substrate was conducted. As a result, in the same as the above experiment using a glass substrate, a ZnO thin film formed by the laser ablation method was better both in filter characteristic and deflection characteristic.

Though the thickness of the surface acoustic element is not specifically limited, it is favorable to be set according to the wavelength of the surface acoustic wave.

Although the present invention has been described with reference to the preferred embodiments above, it is to be noted that various changes and modifications are possible to those who are skilled in the art. Such changes and modifications are to be understood as being within a scope of the present invention.

What is claimed is:

1. A preparation method of a crystalline ZnO thin film formed on a glass member comprising:

irradiating a ZnO target with a laser beam in an atmospheric pressure of $O_2$ gas in the range between $7 \times 10^{-5}$ Torr and $1 \times 10^{-2}$ Torr; and depositing a material generated by the irradiation on a glass member heated to a temperature in the range between 200° C. and 700° C.

2. A method as claimed in claim 1, wherein:

said atmospheric pressure of $O^2$ gas is in the range between $2 \times 10^{-4}$ Torr to $2.5 \times 10^{-3}$ a Torr; and said glass member is heated to a temperature in the range between 360° C. and 600° C.

3. A method as claimed in claim 1, wherein:

said atmospheric pressure of $O^2$ gas is in the range between $2 \times 10^{-4}$ Torr to $6 \times 10^{-4}$ Torr; and said glass member is heated to a temperature in the range between 500° C. and 600° C.

4. A method as claimed in claim 1, further comprising treating said glass member with a compound containing an element selected from the group consisting of alkali metals, alkaline earth metals and boron.

5. A method as claimed in claim 1, wherein said glass member has an undercoating layer on the surface thereof.

6. A method as claimed in claim 1, wherein said ZnO target contains a heterocompound containing a heteroatom selected from the group consisting of Cu and Al.

7. A method as claimed in claim 1, wherein said formation of the ZnO thin film comprises:

a first process of forming a first layer on a glass member; and a second process of forming a second layer on the first layer, wherein said second process is performed in a different condition from the first process.

8. A crystalline ZnO thin film formed on a glass member, which has a crystallographic orientation of <001> axis in a perpendicular direction to the surface of the glass member, and is produced by a laser ablation method comprising:

irradiating a ZnO target with a laser beam in an atmospheric pressure of $O_2$ gas in the range between $7 \times 10^{-5}$ Torr and $1 \times 10^{-2}$ Torr; and depositing a material generated by the irradiation on a glass member heated to a temperature in the range between 200° C. and 700° C. to form a thin film on the glass member.

9. An acoustooptic deflection element comprising a crystalline ZnO thin film formed on a glass member, wherein said thin film is produced by a laser ablation method comprising:

irradiating a ZnO target with a laser beam in an atmospheric pressure of $O_2$ gas in the range between $7 \times 10^{-5}$ Torr and $1 \times 10^{-2}$ Torr; and depositing a material generated by the irradiation on a glass member heated to a temperature in the range between 200° C. and 700° C. to form a thin film on the glass member.

10. A preparation method of a crystalline thin film, which comprises forming a thin film on a base member by a laser ablation method in order to obtain a crystallographic orientation of <001> axis of the thin film in a perpendicular direction to the surface of the base member.

11. A preparation method of a crystalline ZnO thin film comprising:

irradiating ZnO target with a laser beam, wherein said ZnO target contains a heterocompound; and depositing a material generated by the irradiation on a heated base member, so as to form a thin film on the base member.

12. A method as claimed in claim 11, wherein said heterocompound comprises a compound containing a heteroatom selected from the group consisting of Cu and Al.

13. A method as claimed in claim 11, wherein said base member is made of glass.

14. A method as claimed in claim 11, further comprising treating said base member with a compound containing a heteroatom selected from the group consisting of alkali metals, alkaline earth metals and boron.

15. A method as claimed in claim 11, wherein said base member has an undercoating layer on the surface thereof.

16. A crystalline ZnO thin film formed on a base member which is produced by a laser ablation method comprising:

irradiating a ZnO target with a laser beam, wherein said ZnO target contains a heterocompound; and depositing a material generated by the irradiation on a heated base member.

17. An acoustooptic deflection element comprising a crystalline ZnO thin film formed on a base member, wherein said ZnO thin film is produced by a laser ablation method comprising:

irradiating a ZnO target with a laser beam, wherein said ZnO target contains heterocompound; and depositing a material generated by the irradiation on a heated base member.

18. A preparation method of a crystalline thin film which comprises a laser ablation method using a target containing a heterocompound in order to adjust a resistivity of the thin film obtained thereby.

19. A preparation method of a crystalline thin film comprising:

a first process of forming a first layer on a base member; and a second process of forming a second layer on the first layer, wherein said second process is performed in a different condition from the first process and at least one of said first and second processes is a laser ablation method.

20. A method as claimed in claim 19, wherein the temperature of said base member in the first process is different from that in the second process.

21. A method as claimed in claim 19, wherein the film formation rate of the first process is different from that of the second process.

22. A preparation method of a crystalline thin film comprising:

a first process of forming a first layer on a base member; and a second process of forming a second layer on the first layer, wherein said second process uses a different method than said first process and one of said first and second processes is a laser ablation method.

23. A method as claimed in claim 19, wherein said base member is made of glass.

24. A method as claimed in claim 19, wherein said thin film comprises ZnO.

25. A method as claimed in claim 19, wherein said laser ablation method uses a target containing a heterocompound.

26. A method as claimed in claim 19, further comprising treating said base member with a compound containing an element selected from the group consisting of alkali metals, alkaline earth metals and boron.

27. A method as claimed in claim 19, wherein said base member has an undercoating layer on the surface thereof.

28. A crystalline thin film formed on a base member, which is prepared by a method comprising:
   a first process of forming a first layer on a base member; and
   a second process of forming a second layer on the first layer, wherein said second process is performed in a different condition from the first process and at least one of said first and second processes is a laser ablation method.

29. An acoustooptic deflection element prepared by a method comprising:
   a first process of forming a first ferroelectric layer on a base member; and
   a second process of forming a second ferroelectric layer on the first layer, wherein said second process is performed in a different condition from the first process and at least one of said first and second processes is a laser ablation method.

30. A preparation method of crystalline thin film comprising:
   treating a surface of a base member with a compound containing an element selected from the group consisting of alkali metals, alkaline earth metals and boron; and
   forming a crystalline thin film on the treated base member by a laser ablation method.

31. A method as claimed in claim 30, wherein said base member is treated with an aqueous solution of a hydroxide selected from the group consisting of alkali metal hydroxides and alkaline earth metal hydroxides.

32. A method as claimed in claim 30, wherein said base member is made of glass.

33. A method as claimed in claim 30, wherein said thin film comprises ZnO.

34. A crystalline thin film formed on a base member which is produced by a method comprising:
   treating a surface of a base member with a compound containing an element selected from the group consisting of alkali metals, alkaline earth metals and boron; and
   forming a crystalline thin film on the treated base member by a laser ablation method.

35. An acoustooptic deflection element comprising a crystalline thin film produced by a method comprising:
   treating a surface of a base member with a compound containing an element selected from the group consisting of alkali metals, alkaline earth metals and boron; and
   forming a ferroelectric thin film on the treated base member by a laser ablation method.

36. A preparation method of a crystalline thin film comprising:
   forming an undercoating layer on a base member; and
   forming a crystalline thin film on the undercoating layer by a laser ablation method.

37. A method as claimed in claim 36, wherein said undercoating layer comprises a compound selected from the group consisting of $SiO_2$, alkaline metal oxides, alkaline earth metal oxides, alkaline metal halides and alkaline earth metal halides.

38. A preparation method as claimed in claim 36, wherein said undercoating layer is prepared by a laser ablation method.

39. A method as claimed in claim 36, wherein said base member is made of glass.

40. A method as claimed in claim 36, wherein said base member is made of silicon.

41. A method as claimed in claim 36, wherein said thin film comprises ZnO.

42. A crystalline thin film formed on a base member which is produced by a method comprising:
   forming an undercoating layer on a base member; and
   forming a crystalline thin film on the undercoating layer by a laser ablation method.

43. An acoustooptic deflection element produced by a method comprising:
   forming an undercoating layer on a base member; and
   forming a ferroelectric thin film on the undercoating layer by a laser ablation method.

* * * * *